United States Patent [19]
Clouser et al.

[11] Patent Number: 5,454,926
[45] Date of Patent: Oct. 3, 1995

[54] ELECTRODEPOSITED COPPER FOIL

[75] Inventors: Sidney J. Clouser, Chardon; Dino F. DiFranco, Mayfield Village; Craig J. Hasegawa, Euclid, all of Ohio

[73] Assignee: Gould Electronics Inc., Eastlake, Ohio

[21] Appl. No.: 363,704

[22] Filed: Dec. 23, 1994

Related U.S. Application Data

[62] Division of Ser. No. 865,791, Apr. 7, 1992, which is a continuation of Ser. No. 531,425, May 30, 1990, abandoned.

[51] Int. Cl.$^6$ .................................................. C25D 1/04
[52] U.S. Cl. ........................ 205/50; 205/77; 428/606; 428/687; 428/935
[58] Field of Search ................ 205/77, 50; 428/606, 428/687, 935

[56] References Cited

U.S. PATENT DOCUMENTS

| | | | |
|---|---|---|---|
| 2,475,974 | 7/1949 | Max | 204/52 |
| 2,482,354 | 9/1949 | Max et al. | 204/52 |
| 2,563,360 | 8/1951 | Phillips et al. | 204/52 |
| 2,700,019 | 1/1955 | Jrnstedt et al. | 205/298 |
| 2,859,159 | 11/1958 | Wernlund | 204/44 |
| 2,876,178 | 3/1959 | McCoy | 204/52 |
| 2,903,403 | 9/1959 | Grauss | 205/296 |
| 3,682,788 | 8/1972 | Kardas et al. | 205/298 |
| 3,864,227 | 2/1975 | Brytczuk et al. | 204/108 |
| 4,082,591 | 4/1978 | Morisaki et al. | 156/150 |
| 4,169,018 | 9/1979 | Berdon et al. | 204/13 |
| 4,386,139 | 5/1983 | Nakatsugawa | 428/607 |
| 4,387,006 | 6/1983 | Kajiwara et al. | 204/32 R |
| 4,647,345 | 2/1987 | Polan | 205/77 |
| 4,686,017 | 8/1987 | Young | 204/45.1 |
| 4,781,001 | 11/1988 | Frisby | 205/298 |
| 4,834,842 | 5/1989 | Langner et al. | 204/17 |
| 4,956,053 | 9/1990 | Polan | 204/13 |
| 5,049,221 | 9/1991 | Wada et al. | 156/151 |
| 5,171,417 | 12/1992 | DiFranco et al. | 205/77 |
| 5,181,770 | 1/1993 | Brock et al. | 205/77 |

FOREIGN PATENT DOCUMENTS

| | | |
|---|---|---|
| 0250195 | 12/1987 | European Pat. Off. |
| 33074 | 3/1977 | Japan |
| 5438053 | 11/1979 | Japan |
| 310989 | 12/1988 | Japan |
| 310990 | 12/1988 | Japan |

OTHER PUBLICATIONS

Chem. Abstract, vol. 45, No. 2, Chem Abstract No. 14254j.
EPO Search Report for Application 91911599.8, mailed Feb. 9, 1993.
C. W. Bennett, Tensile Strength of Electrolytic Copper on a Rotating Cathode, Trans. Am. Electrochem. Soc., 21, 253 (1912).
Bucci et al. "Copper Foil Technology," PC FAB, Jul., 1986, pp. 22–33.
Anderson et al, "Tensile Properties of Acid Copper Electrodeposits," Journal of Applied Electrochemistry 15, (1985), pp. 631–637.
Lakshmanan et al, "The Effect of Chloride Ion in the Electrowinning of Copper," Journal of Applied Electrochemistry 7, (1977), pp. 81–90.

(List continued on next page.)

*Primary Examiner*—John Niebling
*Assistant Examiner*—Kishor Mayekar
*Attorney, Agent, or Firm*—Michael A. Centanni

[57] ABSTRACT

This invention relates to electrodeposited copper foil having an elongation measured at 180° C. in excess of about 5.5%, an ultimate tensile strength measured at 23° C. in excess of about 60,000 psi, and a matte-side $R_{tm}$ in the range of about 4.5 to about 18 μm. This invention also relates to a process for making electrodeposited copper foil which comprises: preparing a copper deposition bath comprising water, copper ions and sulfate ions, said bath containing less than about 20 ppm chloride ions; and applying electric current to said bath to electrodeposit copper from said bath using a current density in the range of about 200 to about 3000 amps per square foot.

18 Claims, 4 Drawing Sheets

OTHER PUBLICATIONS

Lamb et al, "Physical and Mechanical Properties of Electrodeposited Copper III–Deposites from Sulfate, Fluoborate, Pyrophosphate, Cyanide, and Amine Baths," Journal of the Electrochemical Society, Sep., 1970, pp. 291C–318C.

Lamb et al, "Physical and Mechanical Properties of Electrodeposited Copper II. The Sulfate Bath", Jan. 1966, pp. 86–95.

Lamb et al, "Physical and Mechanical Properties of Electrodeposited Copper: I. Literature Survey", Dec. 1965, pp. 1289–1311.

N. P. Fedot'ev, P. M. Vyacheslaovov, V. I. Gribl, and E. M. Zalesskaya, The Tensile Strength and Microhardness of Electrodeposited Copper, J. Applied Chem. (USSR), 37,691 (1964). (English translation, Consultants Bureau, NY).

D. M. Lyde, Copper Pyrophosphate Plating, Metal Industry (London), 101, 82 (1962).

Jernstedt, Leveling With PR Current Plating, Proc. Am. Electroplaters' Soc., 37, 151 (1950).

Heussner et al, Some Metallurgical Aspects of Electrodeposits, Plating, 35, 554, 719 (1948).

Jernstedt, Brightener Finishes via PR Plating Westinghouse Engr., 10, No. 3, 139 (1943).

Wen et al, "The Effect of Organic and Inorganic Addition Agents Upon the Electrodeposition of Copper from Electrolytes Containing Arsenic".

Advice copy from General Meeting of Americal Electrochemical Society, Sep. 21–23, 1911.

Ex. 1  Ex. 1-C

Ex. 2  Ex. 2-C

Ex. 3  Ex. 3-C

Ex. 4  Ex. 4-C

Ex. 5  Ex. 5-C

Ex. 6  Ex. 6-C

Ex. 14

Ex. 14-C

Ex. 15

Ex. 15-C 5,454,926

ELECTRODEPOSITED COPPER FOIL

This is a division of application Ser. No. 07/865,791, filed Apr. 7, 1992 which is a continuation of application Ser. No. 07/531,425, filed May 30, 1990, now abandoned.

TECHNICAL FIELD

This invention relates to electrodeposited copper foils which are useful in making printed circuit boards and the like, and to a process for making such foils. The foils are characterized by a unique combination of properties, namely, an elongation measured at 180° C. in excess of about 5.5%, an ultimate tensile strength measured at 23° C. in excess of about 60,000 psi, and a matte-side $R_{tm}$ in the range of about 4.5 to about 18 µm. The process involves the use of an electrolyte solution having a chloride ion content of less than about 20 ppm and a current density in the range of about 200 to about 3000 amps per square foot.

BACKGROUND OF THE INVENTION

The production of copper foil by electrochemical processes involves the use of a cell containing an anode, a cathode, an electrolyte solution containing copper ions and sulfate ions, and a source of current. Through the application of voltage between the anode and the cathode the deposition of copper is effected on the cathode surface.

The production of electrodeposited copper foil begins with the feed stock which can be copper shot, wire, recycled copper, etc. The copper feed stock is dissolved in sulfuric acid to form the electrolyte solution. The process can be accelerated by raising the temperature of the solution and by bubbling air through it. The resulting copper sulfate solution is then purified in order to ensure that high purity copper sulfate required for the production of foil is generated. Various types of agents for controlling the properties of the foil such as animal glue and thiourea can be added to the electrolyte solution.

The electrolyte solution is pumped into an electroforming cell, and with the application of voltage between the anode and cathode, the electrodeposition of copper takes place. Typically the process involves using cylindrical cathodes that may be of varying diameters and widths. The anodes that are used conform to the curvature of the cathodes so as to maintain constant separation between the two.

The qualities and characteristics of the copper foil that is produced are a function of many parameters such as current density, temperature, substrate material, solution agitation and electrolyte solution composition. A problem that has persisted in the art is that to date it has not been possible to produce low-profile copper foils with high ultimate tensile strengths and high elevated temperature elongations. The common practice of adding chloride ions to yield ductile electrodeposits induces a decrease in ultimate tensile strength. When chloride ions are present in electrolyte solutions at common concentrations of 50 ppm or higher it is not possible to increase the ultimate tensile strength and high-temperature elongation to desired levels by changes in, for example, the concentration of animal glue or thiourea, or by changes in the current density.

Lakshmanan et al, "The Effect of Chloride Ion in the Electrowinning of Copper", Journal of Applied Electrochemistry 7 (1977) 81–90, discloses that the effect of chloride ion concentration on copper electrodeposition is dependent on the operating current density. At lower current density values the ridge type growth structure orientation is favored for additive-free electrolytes. At high current density values pyramidal growth orientation is favored for additive-free electrolytes. The addition of chloride ion to the 10 ppm level lowers the overvoltage and thus promotes ridge type oriented deposits. As the current density is increased to 40 amps per square foot, the pyramidal growth structure is again favored. The article indicates that the current densities that were tested ranged from 15 to 40 amps per square foot.

Anderson et al, "Tensile Properties of Acid Copper Electrodeposits", Journal of Applied Electrochemistry, 15 (1985) 631–637, discloses that the chloride ion concentration in an acid copper plating bath influences the ultimate tensile strength and elongation of the foil produced therefrom. The article indicates that at the current densities tested, acid copper plating baths require the presence of chloride ions to provide a ductile copper deposit. The current densities reported in the article ranged from 20 to 50 mA/cm$^2$ [18.58 to 46.45 amps per square foot]. Chloride ion concentrations in the range of 0 to 100 ppm are reported.

U.S. Pat. No. 2,475,974 discloses a process for making copper deposits having tensile strengths of about 60,000 to about 73,000 psi and elongations of 6% to 9% using a copper plating solution containing triethanolamine.

U.S. Pat. No. 2,482,354 discloses a process for making copper deposits having tensile strengths of about 65,000 to about 90,000 psi and elongations of 8% to 12% using a copper plating solution containing triisopropanolamine.

SUMMARY OF THE INVENTION

This invention relates to electrodeposited copper foil having an elongation measured at 180° C. in excess of about 5.5%, an ultimate tensile strength measured at 23° C. in excess of about 60,000 psi, and a matte-side $R_{tm}$ in the range of about 4.5 to about 18 µm. This invention also relates to a process for making electrodeposited copper foil which comprises: preparing a copper deposition bath comprising water, copper ions and sulfate ions, said bath containing less than about 20 ppm chloride ions; and applying electric current to said bath to electrodeposit copper from said bath using a current density in the range of about 200 to about 3000 amps per square foot.

DESCRIPTION OF THE PREFERRED EMBODIMENT

Figure 1:
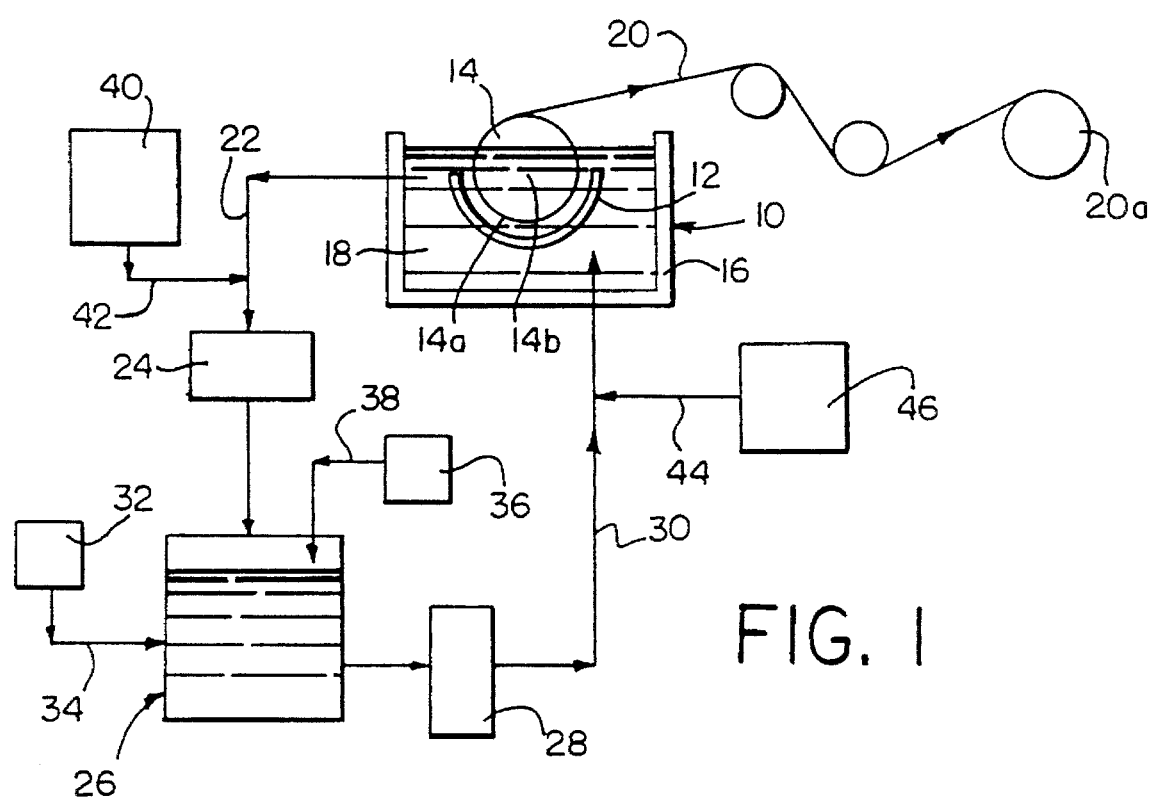
FIG. 1 is a flow sheet illustrating the process of the invention in a preferred embodiment.

The ultimate tensile strength (UTS) for the inventive copper foils at 23° C. is in excess of about 60,000 psi, more preferably in excess of about 62,000 psi, more preferably in excess of about 64,000 psi, more preferably in excess of about 66,000 psi, more preferably in excess of about 68,000 psi, more preferably in excess of about 70,000 psi, using Test Method 2.4.18 of IPC-TM—650.

The UTS for these foils at 180° C. is preferably in excess of about 25,000 psi, more preferably in excess of about 30,000 psi, more preferably in excess of about 32,000 psi, more preferably in excess of about 35,000 psi using the foregoing test method.

The elongation for these foils at 180° C. is in excess of about 5.5%, preferably in excess of about 6%, more preferably in excess of about 8%, more preferably in excess of about 10% using Test Method 2.4.18 of IPC-TM-650. The elongation at 180° C. for these foils is preferably in the range of 5.5% to about 40%, more preferably about 6% to about 35%.

The inventive copper foils preferably have weights in the range of about ⅛ to about 14 ounces per square foot, more preferably about ¼ to about 6 ounces per square foot, more preferably about ¼ to about 2 ounces per square foot. In preferred embodiments, these foils have weights of about ¼, ⅜, ½, 1 or 2 ounces per square foot.

The inventive copper foils preferably have matte-side roughnesses, $R_{tm}$, of about 4.5 to about 18 μm, more preferably about 4.5 to about 15 μm, more preferably about 4.5 to about 9 μm. $R_{tm}$ is the mean of the maximum peak-to-valley vertical extents from each of five consecutive sampling lengths, and can be measured using a Surftronic 3 profilometer marketed by Rank Taylor Hobson, Ltd., Leicester, England. In one embodiment of the invention, these foils have weights of about ½ ounce per square foot and untreated matte sides, the $R_{tm}$ of such matte sides preferably being about 4.5 to about 8 μm, more preferably about 4.5 to about 6 μm. In another embodiment, these foils have weights of about 1 ounce per square foot and untreated matte sides, the $R_{tm}$ of such matte sides preferably being about 4.5 to about 10 μm, more preferably about 6 to about 9 μm. In another embodiment, these foils have weights of about 2 ounce per square foot and untreated matte sides, the $R_{tm}$ of such matte sides preferably being about 4.5 to about 15 μm, more preferably about 9 to about 14 μm, more preferably about 10 to about 13 μm.

In another embodiment, these foils have weights of about ½ ounce per square foot and treated matte sides, the $R_{tm}$ of such treated matte sides preferably being about 4.5 to about 12 μm, more preferably about 7 to about 9 μm. In another embodiment, these foils have weights of about 1 ounce per square foot and treated matte sides, the $R_{tm}$ of such treated matte sides preferably being about 4.5 to about 14 μm, more preferably about 10 to about 12 μm. In another embodiment, these foils have weights of about 2 ounces per square foot and treated matte sides, the $R_{tm}$ of such treated matte sides preferably being about 4.5 to about 16 μm, more preferably about 11 to about 14 μm.

The term "untreated" is used herein to refer to raw or base foil that has not undergone subsequent treatment for the purpose of refining or enhancing the foil properties. The term "treated" is used herein to refer to raw or base foil that has undergone such treatment. This treatment is entirely conventional and typically involves the use of various treating and rinsing solutions. For example, a thin layer of a barrier material such as indium, zinc, tin, nickel, cobalt, brass (copper-zinc alloys), bronze (copper-tin alloys), etc., can be applied to the foil using known electrodeposition procedures. The barrier layer can be preceded by an anchoring or bonding treatment, an example being the deposition of thin layer of copper on the foil surface from a copper sulfate bath. The barrier layer can be coated with a surface stabilizer to prevent oxidation and staining of the foil, examples of which include chromium, chromium-zinc and tin. These treating techniques are well-known in the art.

The $R_{tm}$ for the shiny side of these foils is preferably less than about 6 μm, more preferably less than about 5 μm, and is preferably in the range of about 2 to about 6 μm, more preferably in the range of about 2 to about 5 μm.

The inventive process is entirely conventional with the exception that high current densities are used and it is critical to maintain the chloride ion concentration in the electrolyte solution at preferably less than about 20 ppm, preferably less than about 15 ppm, more preferably less than about 10 ppm, more preferably less than about 5 ppm. Although minor amounts of chloride ions can be added to the electrolyte solution, provided the concentration of chloride ions does not exceed the above-indicated levels, it is preferred not to add any chloride ions to the electrolyte solution. Thus, in one embodiment of the invention no chloride ions are added to the electrolyte solution, and the only chloride ions, if any, that are present are as a result of contamination. In commercial applications it is difficult, if not impossible, to avoid completely the presence of chloride ions in the electrolyte solution due to the fact that chloride ions are a common contaminant in water and in bulk ingredients. The chloride ion concentration in the electrolyte solution can be controlled by techniques that are well known in the art. For example, chloride can be precipitated from the electrolyte solution with silver or it can be electrolyzed from solution as chlorine gas using an insoluble anode.

It is critical to maintain the current density preferably in the range of about 200 to about 3000 amps per square foot, more preferably about 400 to about 3000 amps per square foot, more preferably about 800 to about 3000 amps per square foot, more preferably about 1000 to about 3000 amps per square foot. In one embodiment, current densities in the range of about 400 to about 2000 amps per square foot are useful. In one embodiment, current densities in the range of about 800 to about 1700 amps per square foot are useful. In one embodiment, current densities in the range of about 1000 to about 1500 amps per square foot are useful.

The electrolyte solution preferably has a copper ion concentration in the range of about 50 to about 120 grams per liter, more preferably about 75 to about 110 grams per liter. The copper ion source can be any copper feed stock used in the art, examples of which include copper shot, recycled copper, wire, etc.

The sulfate ion concentration in the electrolyte solution is preferably in the range of about 50 to about 110 grams per liter, more preferably about 70 to about 90 grams per liter. The sulfate ion source is preferably sulfuric acid. Examples of other sulfate ion sources include sodium, potassium or copper sulfate.

The electrolyte solution can optionally contain one or more active sulfur-containing materials. The term "active-sulfur containing material" refers to materials characterized generally as containing a bivalent sulfur atom both bonds of which are directly connected to a carbon atom together with one or more nitrogen atoms also directly connected to the carbon atom. In this group of compounds the double bond may in some cases exist or alternate between the sulfur or nitrogen atom and the carbon atom. Thiourea is a useful active sulfur-containing material. The thioureas having the nucleus

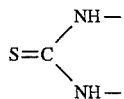

and the iso-thiocyanates having the grouping S=C=N— are useful. Thiosinamine (allyl thiourea) and thiosemicarbazide are also useful. The active sulfur-containing material should be soluble in the electrolyte solution and be compatible with the other constituents. The concentration of active sulfur-containing material in the electrolyte solution is preferably up to about 15 ppm, more preferably in the range of about 0.1 to about 15 ppm.

The electrolyte solution can optionally contain one or more gelatins. The gelatins that are useful herein are heterogeneous mixtures of water-soluble proteins derived from collagen. These gelatins can be obtained by boiling animal skin, tendons, ligaments, bones, etc., with water. Animal glue is a preferred gelatin because it is relatively inexpensive, commercially available and convenient to handle. The concentration of gelatin in the electrolyte solution is preferably up to about 20 ppm, more preferably up to about 10 ppm, and preferably in the range of about 0.2 to about 10 ppm.

The electrolyte solution can contain other additives known in the art for controlling the properties of the electrodeposited foil. Examples include molasses, gum arabic, the polyalkylene glycols (e.g., polyethylene glycol, polypropylene glycol, polyisopropylene glycol, etc.), dithiothreitol, amino acids (e.g., proline, hydroxyproline, cysteine, etc.), acrylamide, sulfopropyl disulfide, tetraethylthiuram disulfide, benzyl chloride, epichlorohydrin, chlorohydroxylpropyl sulfonate, alkylene oxides (e.g., ethylene oxide, propylene oxide, etc.), the sulfonium alkane sulfonates, thiocarbamoyldisulfide, selenic acid, or a mixture of two or more thereof.

In one embodiment, the electrolyte solution Is characterized by the absence of tri-isopropanolamine or triethanolamine or both. In one embodiment, the electrolyte is characterized by the absence of pyrophosphate. In one embodiment, the electrolyte is characterized by the absence of cyanide.

The temperature of the electrolyte solution can range from just above the crystallization point of copper sulfate to just below the temperature at which water vaporizes from the solution. The temperature is preferably in the range of about 40° C. to about 80° C., more preferably about 55° C. to about 60° C.

The inventive process is commenced by forming the electrolyte solution, preferably by dissolving (or digesting) a metallic copper feed stock in sulfuric acid. After the copper is dissolved the solution is subjected to a purification process to ensure that the electrodeposited foil contains no disruptions and/or discontinuities. Various agents, such as active sulfur-containing material and/or gelatin as well as other agents known in the art for controlling the properties of the electrodeposited foil, can be added to the solution. The solution is pumped into the electroforming cell and when voltage is applied between the anode and cathode, electrodeposition of copper occurs at the cathode. The electric current is preferably direct current or alternating current with a direct current bias. In one embodiment, the process involves the use of rotatable cylindrical cathodes that may be of various diameters and widths. The electrodeposited foil is then removed from the cylindrical cathode as a continuous web as the cathode rotates. The anodes typically are configured to conform to the shape of the cathode so that the separation or gap therebetween is constant. This is desirable in order to produce a foil having a consistent thickness across the web.

The inventive copper foils have a smooth or shiny (drum) side and a rough or matte (copper deposit growth front) side. These foils can be bonded to dielectric substrates to provide dimensional and structural stability thereto, and in this regard, it is preferred to bond the matte side of the electrodeposited foil to the substrate so that the shiny side of the foil faces outwardly from the laminate. Useful dielectric substrates may be prepared by impregnating woven glass reinforcement materials with partially cured resins, usually epoxy resins. These dielectric substrates are sometimes referred to as prepregs.

In preparing the laminates, it is preferred for both the prepreg material and the electrodeposited copper foil to be provided in the form of long webs of material rolled up in rolls. The rolled materials are drawn off the rolls and cut into rectangular sheets. The rectangular sheets are then laid-up or assembled in stacks of assemblages. Each assemblage may comprise a prepreg sheet with a sheet of foil on either side thereof, and in each instance, the matte side of the copper foil sheet is positioned adjacent the prepreg so that the shiny sides of the sheets of foil face outwardly on each side of the assemblage.

The assemblage may be subjected to conventional laminating temperatures and pressures between the plates of laminating presses to prepare laminates comprising sandwiches of a sheet of prepreg between sheets of copper foil. The prepregs may consist of a woven glass reinforcement fabric impregnated with a partially cured two-stage resin. By application of heat and pressure, the matte side of the copper foil is pressed tightly against the prepreg and the temperature to which the assemblage is subjected activates the resin to cause curing, that is crosslinking of the resin and thus tight bonding of the foil to the prepreg dielectric substrate. Generally speaking, the laminating operation will involve pressures in the range of from about 250 to about 750 psi, temperatures in the range of from about 175° C. to 235° C. and a laminating cycle of from about 40 minutes to about 2 hours. The finished laminate may then be utilized to prepare printed circuit boards (PCB).

Conductive foils for PCB applications are preferably treated, at least on the matte side, for enhanced bonding and peel strength between the matte side and the laminate. Preferably the foil treatment involves treatment with a bonding material to increase surface area and thus enhance bonding and increase peel strength. The foil may also be treated to provide a thermal barrier, which may be brass, to prevent peel strength from decreasing with temperature. Finally, the foil may be treated with a stabilizer to prevent oxidation of the foil. These treatments are well known in the art.

A number of manufacturing methods are available for preparing PCBs from laminates. Additionally, there is a myriad of possible end use applications including radios, televisions, computers, etc., for the PCB's. These methods and end uses are known in the art.

In one embodiment of the invention a continuous electrodeposition process for making copper foil is provided. A flow sheet of this process is depicted in FIG. 1. The apparatus used with this process includes an electroforming cell 10 that includes anode 12, cathode 14, vessel 16 and electrolyte solution 18. Anode 12 is submerged in electrolyte solution 18, and cathode 14 is partially submerged in electrolyte solution 18.

Electrolyte solution 18 contains copper ions and sulfate ions, and is characterized by a chloride ion content of less than 20 ppm. Electrolyte solution 18 can also contain an active sulfur-containing material such as thiourea and/or a gelatin such as animal glue. Electrical means that are well known in the art are provided for applying an electrical current between anode 12 and cathode 14. The current is preferably direct current or alternating current with a direct current bias. Copper ions in solution 18 gain electrons at the peripheral surface 14a of cathode 14 whereby metallic copper plates out in the form of a foil layer web 20. Cathode 14 rotates continuously about its axis 14b during the process and foil layer 20 is continuously withdrawn from surface 14a as a continuous web which is formed into a roll 20a.

The process depletes the electrolyte solution of copper ions and sulfate ions, and, if used, gelatin and active sulfur-containing material. These ingredients are continuously replenished. Electrolyte solution 18 is withdrawn through line 22 and recirculated through filter 24, digester 26 and filter 28, and then is reintroduced into vessel 16 through line 30. Sulfuric acid from a source 32 is advanced to digester 26 through line 34. Metallic copper from a source 36 is introduced into digester 26 along path 38. Metallic copper is digested by sulfuric acid to form copper ions in digester 26.

Make-up gelatin is added to the recirculating solution in line 22 from a source 40 through line 42. Active sulfur-containing material is added to the recirculating solution in line 30 through line 44 from a source 46. The sulfur containing material is preferably introduced into the recirculating solution at a point near vessel 16.

The following examples are provided for purposes of illustrating the invention. Unless otherwise indicated, in the following examples as well as throughout the specification and claims, all parts and percentages are by weight, all temperatures are in degrees centigrade, and all pressures are atmospheric.

In each of the following Examples 1–15, an electroforming cell using parallel plate electrodes is used. The anode is iridium coated titanium. The cathode is titanium. The cathode is removable so that copper foil can be peeled from it. A reservoir equipped with a filter is used to mix the electrolyte solution and means are provided to pump the electrolyte solution to and from the electroforming cell. The electrolyte solution has a copper ion concentration 100±5 gms/liter, a sulfuric acid concentration of 80±5 gms/liter, and a chloride ion concentration of 5 ppm. The temperature of the electrolyte solution is 60° C. The electrolyte solution in Examples 1–12 contains animal glue varying in concentrations from 0 to 4 ppm. The electrolyte solution in Examples 13–15 contains thiourea varying in concentrations from 2 to 4 ppm. The flow rate of electrolyte between the electrodes is 124 cm/second.

The current density in amps per square foot (ASF), concentration of animal glue and test results for Examples 1–12 are indicated in Table I. The current density, concentration of thiourea and test results for Examples 13–15 are indicated in Table II. Ultimate tensile strength (UTS) and elongation are determined in accordance with the requirements of Test Method 2.4.18 of IPC-TM-650. The matte-side roughness, $R_{tm}$, is measured using a Surftronic 3 profilometer (Rank Taylor Hobson Ltd., Leicester, England.) The foil samples that are tested are untreated.

TABLE I

| Ex. | Animal Glue (ppm) | Current Density (ASF) | 23° C. UTS (Kpsi) | 23° C. Elong. (%) | 180° C. UTS (Kpsi) | 180° C. Elong. (%) | Matte-Side $R_{tm}$ (μm) |
| --- | --- | --- | --- | --- | --- | --- | --- |
| 1 | 0 | 500 | 63.1 | 12.0 | 31.3 | 15.4 | 11.07 |
| 2 | 0 | 1000 | 68.9 | 10.2 | 32.8 | 20.8 | 7.50 |
| 3 | 0 | 1500 | 78.6 | 7.5 | 25.3 | 35.7 | 6.04 |
| 4 | 1 | 500 | 66.5 | 12.6 | 24.4 | 36.0 | 6.02 |
| 5 | 1 | 1000 | 76.4 | 8.8 | 37.4 | 23.3 | 6.12 |
| 6 | 1 | 1500 | 85.3 | 8.5 | 38.8 | 21.0 | 6.16 |
| 7 | 2 | 500 | 75.8 | 8.3 | 37.1 | 8.5 | 5.20 |
| 8 | 2 | 1000 | 77.5 | 11.3 | 37.5 | 11.7 | 5.98 |
| 9 | 2 | 1500 | 85.4 | 9.7 | 40.4 | 15.3 | 7.21 |
| 10 | 4 | 500 | 74.8 | 10.0 | 39.0 | 5.6 | 4.48 |
| 11 | 4 | 1000 | 80.9 | 10.5 | 37.5 | 9.9 | 4.63 |
| 12 | 4 | 1500 | 83.0 | 7.7 | 40.8 | 5.9 | 5.48 |

TABLE II

| Ex. | Thiourea (ppm) | Current Density (ASF) | 23° C. UTS (Kpsi) | 23° C. Elong. (%) | 180° C. UTS (Kpsi) | 180° C. Elong. (%) | Matte-Side $R_{tm}$ (μm) |
| --- | --- | --- | --- | --- | --- | --- | --- |
| 13 | 2 | 1000 | 70.5 | 9.1 | 37.9 | 13.5 | 5.04 |
| 14 | 4 | 1500 | 89.9 | 8.6 | 47.4 | 7.9 | 4.74 |
| 15 | 4 | 1500 | 73.8 | 8.7 | 33.9 | 13.4 | 8.41 |

For purposes of comparison, Examples 1–15 are repeated with the exception that the chloride ion concentration is increased from 5 ppm to 50 ppm. These comparative examples are identified as Examples 1-C to 15-C. The results for these comparative examples are indicated in Tables III and IV.

TABLE III

| Ex. | Animal Glue (ppm) | Current Density (ASF) | 23° C. UTS (Kpsi) | 23° C. Elong. (%) | 180° C. UTS (Kpsi) | 180° C. Elong. (%) | Matte-Side $R_{tm}$ (μm) |
|---|---|---|---|---|---|---|---|
| 1-C | 0 | 500 | 52.7 | 15.8 | 29.6 | 11.0 | 8.56 |
| 2-C | 0 | 1000 | 61.6 | 13.4 | 25.0 | 37.9 | 9.00 |
| 3-C | 0 | 1500 | 65.2 | 14.6 | 24.8 | 31.8 | 13.34 |
| 4-C | 1 | 500 | 51.7 | 14.0 | 32.1 | 2.6 | 7.75 |
| 5-C | 1 | 1000 | 57.6 | 15.1 | 35.2 | 5.3 | 8.08 |
| 6-C | 1 | 1500 | 67.4 | 13.2 | 39.2 | 3.7 | 10.99 |
| 7-C | 2 | 500 | 49.4 | 7.1 | 29.0 | 2.3 | 7.73 |
| 8-C | 2 | 1000 | 57.8 | 14.5 | 34.5 | 3.8 | 7.71 |
| 9-C | 2 | 1500 | 66.6 | 11.7 | 38.7 | 4.5 | 9.71 |
| 10-C | 4 | 500 | 48.7 | 6.7 | 28.0 | 1.5 | 6.36 |
| 11-C | 4 | 1000 | 56.9 | 14.2 | 32.3 | 2.3 | 6.22 |
| 12-C | 4 | 1500 | 62.9 | 14.1 | 31.8 | 1.8 | 7.46 |

TABLE IV

| Ex. | Thiourea (ppm) | Current Density (ASF) | 23° C. UTS (Kpsi) | 23° C. Elong. (%) | 180° C. UTS (Kpsi) | 180° C. Elong. (%) | Matte-Side $R_{tm}$ (μm) |
|---|---|---|---|---|---|---|---|
| 13-C | 2 | 1000 | 39.4 | 12.9 | 23.4 | 12.9 | 10.76 |
| 14-C | 4 | 1500 | 52.1 | 9.7 | 29.6 | 6.3 | 9.10 |
| 15-C | 4 | 1500 | 50.0 | 10.7 | 26.8 | 9.3 | 9.30 |

The data provided in Examples 1 to 15 indicate that by using a current density of 500 to 1500 amps per square foot and a copper deposition bath with a chloride ion concentration of only 5 ppm, it is possible to obtain a unique combination of foil properties, namely, an elongation measured at 180° C. in the range of 5.6% to 36.0%, an ultimate tensile strength measured at 23° C. in the range of 63,100 to 89,900 psi, and a matte-side $R_{tm}$ in the range of 4.48 to 11.07 μm. Examples 1-C to 15-C, on the other hand, indicate that when the chloride ion concentration was increased to 50 ppm, only Examples 2-C and 3-C provided foil that had the desired properties of an elongation at 180° C. in excess of 5.5%, ultimate tensile strength at 23° C. in excess of 60,000 psi, and a matte-side $R_{tm}$ in the range of 4.5 to 18 μm. A comparison of the properties of the foils produced in Examples 2 and 3 with the foils produced in Examples 2-C and 3-C, respectively, indicates that in each instance the foils produced in Examples 2 and 3 have higher tensile strengths and lower roughness than the foils produced in Examples 2-C and 3-C.

Figure 2:
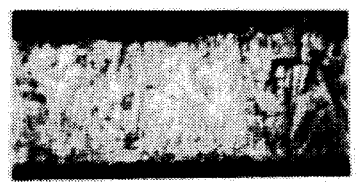
FIG. 2 is a group of photomicrographs taken at magnifications of 1017× of cross-sections of copper foils produced in Examples 1 to 3, and comparative Examples 1-C to 3-C.
Figure 2:
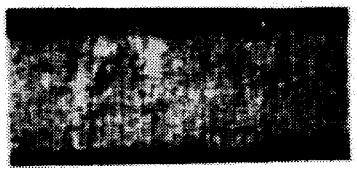
Figure 2:
Figure 3:
FIG. 3 is a group of photomicrographs taken at magnifications of 1017× of cross-sections of copper foils produced in Examples 4 to 6, and comparative Examples 4-C to 6-C.
Figure 3:
Figure 3:
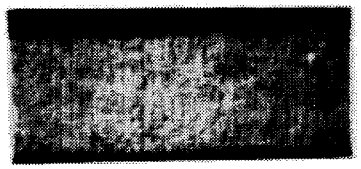
Figure 4:
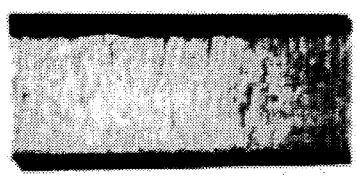
FIG. 4 is a group of photomicrographs taken at magnifications of 1017× of cross-sections of copper foils produced in Examples 7 to 9, and comparative Examples 7-C to 9-C.
Figure 4:
Figure 4:
Figure 5:
FIG. 5 is a group of photomicrographs taken at magnifications of 1017× of cross-sections of copper foils produced in Examples 10 to 12, and comparative Examples 10-C to 12-C.
Figure 5:
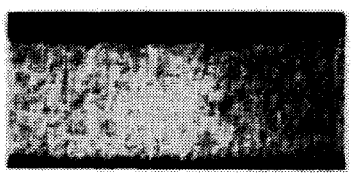
Figure 5:
Figure 6:
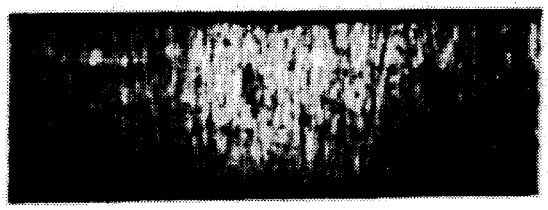
FIG. 6 is a group of photomicrographs taken at magnifications of 1017× of cross-sections of copper foils produced in Examples 14 and 15, and comparative Examples 14-C and 15-C.
Figure 6:
Figure 6:
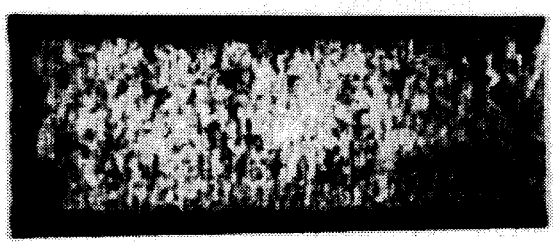
Figure 6:
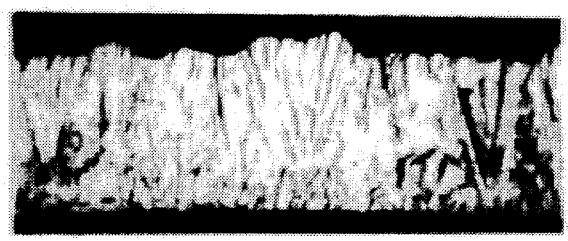

Photomicrographs of cross-sections of the foils produced in Examples 1 to 12, 1-C to 12-C, 14 to 15 and 14-C to 15-C are taken at a magnification of 1017× and are provided herein as FIGS. 2–6. With each of the photomicrographs in FIGS. 2–6, the matte-side is on top and the shiny side is on the bottom. FIG. 2 provides a side-by-side comparison of the foils from Examples 1 to 3, and 1-C to 3-C. FIG. 3 provides a side-by-side comparison of the foils from Examples 4 to 6, and 4-C to 6-C. FIG. 4 provides a side-by-side comparison of the foils from Examples 7 to 9, and 7-C to 9-C. FIG. 5 provides a side-by-side comparison of the foils from Examples 10 to 12, and 10-C to 12-C. FIG. 6 provides a side-by-side comparison of the foils from Examples 14 to 15, and 14-C to 15-C. The photomicrographs in FIGS. 2–6 indicate that the copper foils produced in accordance with the invention at a chloride ion concentration of only 5 ppm (Examples 1 to 12, and 14 to 15) are fine-grained and relatively smooth when compared to the corresponding foils made at chloride ion concentrations of 50 ppm (Examples 1-C to 12-C, 14-C and 15-C).

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

We claim:

1. An electrodeposited copper foil having an elongation measured at 180° C. in excess of about 5.5%, an ultimate tensile strength measured at 180° C. in excess of about 25,000 psi an ultimate tensile strength measured at 23° C. in excess of about 66,000 psi, and a matte-side $R_{tm}$ in the range of about 4.5 to about 18 μm.

2. The foil of claim 1 with an ultimate tensile strength measured at 23° C. in excess of about 68,000 psi.

3. The foil of claim 1 with an ultimate tensile strength measured at 23° C. in excess of about 70,000 psi.

4. The foil of claim 1 with an elongation measured at 180° C. in excess of about 6%.

5. The foil of claim 1 with an elongation measured at 180° C. in excess of about 8%.

6. The foil of claim 1 with an elongation measured at 180° C. in excess of about 10%.

7. The foil of claim 1 with an ultimate tensile strength measured at 180° C. in excess of about 30,000 psi.

8. The foil of claim 1 with an ultimate tensile strength measured at 180° C. in excess of about 32,000 psi.

9. The foil of claim 1 having a weight of about ⅛ to about 14 ounces per square foot.

10. The foil of claim 1 further having a weight of about ¼ ounce per square foot.

11. The foil of claim 1 further having a weight of about ⅜ ounce per square foot.

12. The foil of claim 1 further having a weight of about ½ ounce per square foot.

13. The foil of claim 1 further having a weight of about 1 ounce per square foot.

14. The foil of claim 1 further having a weight of about 2 ounces per square foot.

15. The foil of claim 1 with a matte-side $R_{tm}$ of about 4.5 to about 12 µm and further having a weight of about ½ ounce per square foot.

16. The foil of claim 1 with a matte-side $R_{tm}$ of about 4.5 to about 14 µm and further having a weight of about 1 ounce per square foot.

17. The foil of claim 1 with a matte-side $R_{tm}$ of about 4.5 to about 16 µm and further having a weight of about 2 ounces per square foot.

18. An electrodeposited copper foil having an elongation measured at 180° C. in excess of about 10%, an ultimate tensile strength measured at 180° C. in excess of about 25,000 psi, an ultimate tensile strength measured at 23° C. in excess of about 66,000 psi, and a matte-side $R_{tm}$ in the range of about 4.5 to about 9 µm.

* * * * *